United States Patent
McCandlish et al.

(10) Patent No.: US 6,841,000 B2
(45) Date of Patent: Jan. 11, 2005

(54) MINERALIZER COMPOSITION AND METHOD FOR GROWING ZINC OXIDE CRYSTALS, FILMS AND POWDERS

(75) Inventors: Larry Eugene McCandlish, Highland Park, NJ (US); Robert Uhrin, Morris Plains, NJ (US)

(73) Assignee: Ceramare Corporation, New Brunswick, NJ (US)

( * ) Notice: Subject to any disclaimer, the term of this patent is extended or adjusted under 35 U.S.C. 154(b) by 81 days.

(21) Appl. No.: 10/262,101

(22) Filed: Oct. 1, 2002

(65) Prior Publication Data

US 2003/0084838 A1 May 8, 2003

Related U.S. Application Data

(60) Provisional application No. 60/326,305, filed on Oct. 1, 2001.

(51) Int. Cl.[7] ............................................... C30B 29/16
(52) U.S. Cl. ........................... 117/68; 117/71; 117/944; 423/101; 423/622
(58) Field of Search ............................. 117/68, 71, 944; 423/101, 622

(56) References Cited

U.S. PATENT DOCUMENTS

| | | | |
|---|---|---|---|
| 5,132,104 A | * | 7/1992 | Yamamoto et al. ....... 423/420.2 |
| 6,200,680 B1 | * | 3/2001 | Takeda et al. .............. 428/402 |
| 6,346,184 B1 | * | 2/2002 | Sano et al. ................. 205/199 |
| 6,613,603 B1 | * | 9/2003 | Sano ............................ 438/72 |

OTHER PUBLICATIONS

Suscavage et al., "High Quality Hydrothermal ZnO Crystals", MRS Internet J. Nitride Semicond. Res. 4S1, G3.40 pp. 1–6 1999.*

* cited by examiner

*Primary Examiner*—Robert M Kunemund
(74) *Attorney, Agent, or Firm*—Synnesvedt & Lechner LLP

(57) ABSTRACT

Aqueous mineralizer solutions having retrograde solubility for ZnO contain a mineral acid in which ZnO is soluble and at least one compound of a coordinating ligand for $Zn^{2+}$ ions wherein the coordinating ligand compound is present in an amount that is effective to inhibit $Zn(OH)^+$ ion formation as ZnO is dissolved in the solution. Reduced temperature methods using the mineralizer solutions to grow pure or doped ZnO crystals, pure or doped ZnO thick or thin films, and pure or doped ZnO crystalline powders are also disclosed. Cation doped ZnOs prepared by the inventive methods are also disclosed.

25 Claims, 4 Drawing Sheets

Solubility of ZnO in HNO₃, showing log[m(ZnO)] vs solution pH at 100°C and 290°C.

ZnO solubility limit (molality) vs temperature (°C), comparing ZnO in HNO₃ and ZnO in HNO₃ with acetate.

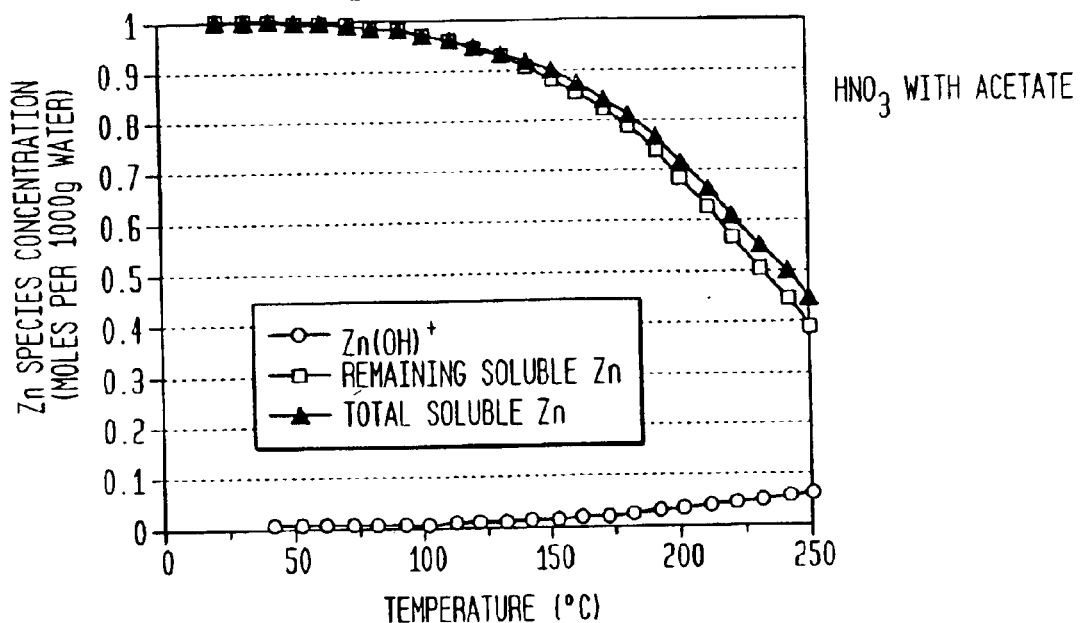
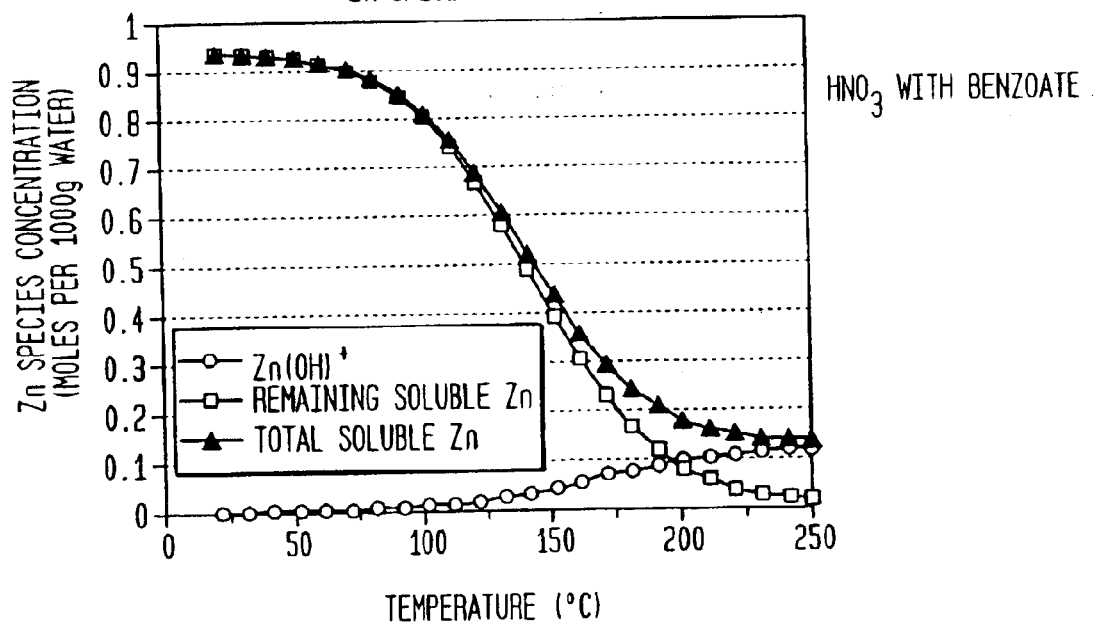

MINERALIZER COMPOSITION AND METHOD FOR GROWING ZINC OXIDE CRYSTALS, FILMS AND POWDERS

CROSS-REFERENCE TO RELATED APPLICATION

This application claims priority benefit of U.S. Provisional Application Ser. No. 60/326,305 filed Oct. 1, 2001, the disclosure of which is incorporated herein by reference.

BACKGROUND OF THE INVENTION

Single crystal zinc oxide (ZnO) is potentially useful in optic, electronic and optoelectronic applications as a light emitter, detector or power device component. Good high temperature characteristics coupled with high excitonic and biexcitonic oscillator strength make ZnO a promising material for optical applications. It is fluorescent as well as electroluminescent and it exhibits visible and ultraviolet photoconductivity. Its wide bandgap makes it attractive for the development of blue and ultraviolet light-emitting diodes and lasers. Its piezoelectric properties have been exploited to make surface acoustic wave devices. Its crystallographic properties make it suitable as a substrate material for growing GaN and related single crystal films. A process for making p-type ZnO would enable high temperature and high power solid-state electronic devices.

Zinc oxide crystallizes in the Wurtzite structure (hexagonal space group $P6_3mc$, a=3.2498, c=5.2066), which makes it a nearly ideal substrate for growing epitaxial GaN films (hexagonal space group $P6_3mc$, a=3.189 c=5.185). The lattice mismatch in the a-direction is less than 2% for ZnO, compared to about 18% for c-cut sapphire. The oxygen atoms are arranged in hexagonal close packing and the zinc atoms occupy half of the tetrahedral holes. Thus each Zn atom is coordinated to four O atoms and each O atom is coordinated to four Zn atoms. The c-axis of the crystal is polar with the (+c) direction conventionally described as "Zn" terminated and the (−c) direction described as "O" terminated. It is a wide bandgap (3.37 eV) II–VI semiconductor. It has a direct gap band structure at room temperature and an excitonic binding energy of 60 meV. Heat-treated ZnO, in which vacancies have been removed by annealing at 800° C., has an electrical resistivity as high as $10^{10}$ ohm-cm. It is piezoelectric. Its melting point is 1975° C. The thermal conductivity of ZnO is moderately high (60 W/m-K). The vapor pressure of ZnO is low at temperatures below 1100° C. but, above this temperature, it rises rapidly.

Historically, there are four ways to grow Zn oxide single crystals: (1) from the melt, (2) from high temperature flux solution, (3) by vapor transport, and (4) by high-temperature hydrothermal means.

(1) Growth from the melt is difficult because of ZnO's high melting point (1975° C.), its high vapor pressure ($P_{vap}$>10 mm-Hg at T>1500° C.) and its tendency to decompose at high temperature. Decomposition at high temperature precluded crystallization from the melt until recently. A proprietary high-pressure process has now been developed by Cermet, Inc. (Atlanta, Ga.) that prevents decomposition and enables crystal growth from the melt in a Bridgman-like arrangement. (See, Nause, J. et al., "Zinc Oxide (ZnO) Substrates", *International Workshop on Zinc Oxide*, (Dayton, Ohio, Oct. 7–8, 1999)). Crystal growth rates are typically in the mm/day range. One difficulty with processes that operate at 2000° C. is that it is difficult to find a suitable material to contain the melt. One solution for ZnO is to use a technique in which the ZnO melt is contained within a ZnO crucible that is kept solid by cooling. This process is inherently expensive because of the high temperatures and high pressures employed.

(2) ZnO crystals can be grown at high temperature in vanadium pentoxidephosphorous pentoxide flux solution by cooling from 1300° C. to 900° C. (See, B. M. Wanklyn, "The growth of ZnO crystal from phosphate and vanadate fluxes," *J. Cryst. Growth*, 7, 107–108 (1970)); in lead fluoride solution by cooling from 1100° C. to 800° C. (See, J. W. Nielsen et al., "Growth of large single crystals of Zinc Oxide," *J. Phys. Chem.*, 64(11), 1762–63 (1960)); or by evaporation of KOH flux between 500° C. and 900° C. (See, M. Ushio and et al., "Synthesis of ZnO single crystals by the flux method," *J. Mat. Sci.*, 28, 218–24 (1993)). In these cases, as with all crystallizations from flux solution, purity and compositional uniformity are serious issues. The highly volatile $PbF_2$ fluxes are notoriously corrosive even toward platinum and present special problems associated with toxicity. Growth rates are in the range of mm/day. These processes are inherently expensive and difficult to control.

(3) Crystal growth by vapor transport (See, Cantwell, G., et al., "Properties of Vapor Grown ZnO", *International Workshop on Zinc Oxide*, (Dayton, Ohio, Oct. 7–8, 1999); E. M. Dodson et al., "Vapour Growth of Single-Crystal Zinc Oxide," *J. Mat. Sci.*, 3, 19–25 (1968); and R. Helbig, "Über die Züchtung von grösseren reinen und dotierten ZnO-Kristtallen aus der Gasphase," *J. Cryst. Growth*, 15, 25–31 (1972)) also takes place at high temperatures (1000–1200° C.) where ZnO(s) reacts with $H_2(g)$ to form $Zn(g)$ and $H_2O(g)$. In this method one establishes a hot zone and a cold zone in the crystallizer. $Zn(g)$ is transported from the hot zone to the cold zone in flowing hydrogen gas where it is reoxidized on either a sapphire or ZnO seed crystal. One problem with crystal growth by vapor transport is that it is difficult to control, and adding dopants to the growing crystal in a controlled manner is especially difficult. Crystal growth rates are typically 1 mm/day. The process is expensive but can produce fairly large, high-quality crystals.

(4) Conventional hydrothermal crystal growth of ZnO (See, R. A. Laudise et al., "Hydrothermal growth of large sound crystals of zinc oxide," *J. Am. Cer. Soc.*, 47 (1), 9–12, (1964); E. D. Kolb et al., *J. Amer. Ceram. Soc.*, 49 303 (1966); I. P. Kuz'mina et al., "Synthesis of zincite by the hydrothermal method," in *Crystallization Processes under Hydrothermal Conditions*, (A. N. Lobachev ed., Studies in Soviet Science; Consultants Bureau, New York-London, 1973); and M. Suscavage et al., "High quality hydrothermal ZnO crystals," *MRS Internet J. Nitride Semicond. Res.*, 4S1, G3.40 (1999)) occurs at much lower temperatures than are used in melt-growth, flux-growth or vapor-transport crystal growth methods but which are nonetheless high temperatures for a hydrothermal process. The crystals are grown in a highly caustic solution at conditions (T=355° C., P=8200 psig) near the solution's critical point. A high-strength alloy autoclave, which is capable of containing the high-pressure fluid, is required. For example, a mixture of $Li_2CO_3$, 4N NaOH and 4N KOH is used as a mineralizer in which ZnO is highly soluble at 355° C. The solubility of ZnO in such conventional basic mineralizers is 'normal', i.e. the solubility is higher at higher temperature.

However, the high temperature and caustic nature of the mineralizer requires that the autoclave be lined with a sealed precious metal liner to prevent contamination of the crystal growth solution and to protect the autoclave from corrosion. Platinum or gold is needed to produce high-resistivity ZnO because less expensive silver is not completely inert at crystallization conditions. Typically, a ΔT equal to a 10 to 20° C. temperature differential is used to achieve transport of ZnO and to achieve the supersaturation condition needed for crystal growth. Pieces of sintered ZnO are preferentially dissolved at the bottom of the autoclave, which is maintained at the high temperature (355° C.). The upper part of the autoclave is maintained at the lower temperature (345° C.) and this is where ZnO seed crystals are placed. In this way the nutrient material is dissolved and transported to the growing crystals by thermal convection. Crystal growth rates are typically 0.25 mm/day. The process can produce large, high-quality ZnO crystals.

There remains a need, however, for lower temperature/pressure processes for growing ZnO single crystals.

SUMMARY OF THE INVENTION

This need is met by the present invention. The present invention provides hydrothermal mineralizer solutions and methods for growing ZnO crystals, films and powders. The methods are useful in growing large ZnO single crystals, in growing thick or thin ZnO crystalline films on substrates, and in making ZnO powders comprising small crystalline particles. The methods facilitate growing ZnO crystals doped with metal cations to produce either n-type or p-type semiconductor ZnO or to adjust the bandgap of the material. The invention also provides crystals grown in the inventive mineralizer solutions.

The invention makes use of the amphoteric nature of ZnO to achieve solubility of ZnO in acidic solutions and provides a means of decreasing the solubility of ZnO when the solution is heated. This retrograde solubility can be used to obtain a state of supersaturation, which is the driving force for crystallization. Retrograde solubility permits hydrothermal crystal growth of ZnO at temperatures in the range 50 to 250° C. compared to temperatures above 300° C., which are needed to grow ZnO crystals in highly basic solutions by conventional hydrothermal means. This reduction in temperature allows the use of polytetrafluoroethylene (PTFE or Teflon™) liners rather than very expensive noble metal liners and allows the use of a low carbon steel vessel rather than an expensive high-strength alloy vessel for pressure containment.

According to one aspect of the present invention, mineralizer solutions are provided having retrograde solubility for ZnO that are aqueous solutions of a mineral acid in which ZnO is soluble and at least one compound of a coordinating ligand for $Zn^{2+}$, wherein the coordinating ligand compound is present in an amount that is effective to inhibit $Zn(OH)^+$ ion formation as ZnO is dissolved in the solution. In a preferred embodiment of this aspect of the invention the mineral acid is either nitric acid or hydrochloric acid and the $Zn^{2+}$-coordinating ligand is acetate, benzoate or formate.

The present invention incorporates the discovery that inhibiting the formation of $Zn(OH)^+$ ions as the ZnO dissolves in the mineral acid solution produces a ZnO solution with retrograde solubility. This is accomplished by the addition of one or more coordinating ligands. The retrograde solubility makes it possible to prepare mineralizer solutions with saturated and supersaturated with ZnO. The present invention therefore also includes mineralizer solutions containing saturated and supersaturated levels of ZnO.

The mineralizer solutions of the present invention can therefore be used to grow pure or doped ZnO single crystals, thick or thin films and crystalline powders. Mineralizer solutions for doping ZnO single crystals, thick or thin films and crystalline powders will contain salts of dopant cations, the concentration of which will depend on the amount of dopant to be incorporated in the ZnO crystal lattice and on the partition coefficient for the dopant ion between the solution and the crystal. This can be readily determined by those skilled in the art without undue experimentation guided by the present specification. Examples of dopant cations include $Li^+$, $Cu^+$, $Ag^+$, $Mg^{2+}$, $Cu^{2+}$, $Ni^{2+}$, $Co^{2+}$, $Fe^{2+}$, $Mn^{2+}$, $Al^{3+}$, $Ga^{3+}$, $In^{3+}$, $Cr^{3+}$, $Mn^{3+}$, $Fe^{3+}$, $Cr^{4+}$ and $Mn^{4+}$.

According to another aspect of the psent invention, methods are provided using the mineralizer solutions of the invention to grow pure or doped ZnO crystals, pure or doped ZnO thick or thin films, and pure or doped ZnO crystalline powders. Methods according to this aspect of the present invention for growing pure or doped ZnO crystals include the steps of heating a mineralizer solution of the invention to a first temperature, dissolving in the mineralizer solution an amount of ZnO effective to form a saturated solution of ZnO in the mineralizer solution at the first temperature; adding a ZnO seed crystal to the ZnO-saturated mineralizer solution; and heating the ZnO-saturated mineralizer solution to a temperature at which a supersaturation condition exists at a rate that drives ZnO growth on the seed crystal.

Methods according to this aspect of the present invention for growing pure or doped ZnO thick or thin films include the steps of heating a mineralizer solution of the invention to a first temperature, dissolving in the mineralizer solution an amount of ZnO effective to form a saturated solution of ZnO in the mineralizer solution at the first temperature; contacting the ZnO-saturated mineralizer solution with a substrate for the thick or thin film, and heating the ZnO-saturated mineralizer solution to a temperature at which a supersaturation condition exists at a rate of heating that drives heteroepitaxial ZnO growth on said substrate. Methods for growing thick or thin films include methods in which this process is repeated to produce a multi-layer laminate. Multiple layers of the same material may be applied, or multiple layers may be applied that are different, either by having a different dopant cation, or by being dopant-free.

Methods according to this aspect of the present invention for growing pure or doped ZnO crystalline powders include the steps of heating a mineralizer solution of the invention to a first temperature, dissolving in the mineralizer solution an amount of ZnO effective to form a saturated solution of ZnO in the mineralizer solution at the first temperature; and heating the ZnO-saturated mineralizer solution to a temperature at which a supersaturation condition exists at a rate of heating that causes homogeneous nucleation and precipitation of crystalline ZnO powder.

Entirely new chemistries for the incorporation of dopant cations are made possible or easier because the chemical environment is acidic rather than basic. Cation-doped ZnO can be produced that could heretofore not be obtained. Therefore, another aspect of the present invention provides cation-doped ZnO single crystals, thick and thin films, and crystalline powders prepared by the methods of the present invention.

Other features of the present invention will be pointed out in the following description and claims, which disclose the principles of the present invention, and the best modes which are presently contemplated for carrying them out.

BRIEF DESCRIPTION OF THE DRAWINGS

FIG. 5 depicts the temperature dependence of the concentration of $Zn(OH)^+$ (circles) and other soluble zinc species (squares) to the overall solubility of ZnO (triangles) in nitric acid (2 m) solution to which $KOOCCH_3$ (2.5 m) has been added;

FIG. 6 depicts the temperature dependence of the concentration of $Zn(OH)^+$ (circles) and other soluble zinc species (squares) to the overall solubility of ZnO (triangles) in nitric acid (2 m) solution to which potassium benzoate (2.5 m) has been added.

DETAILED DESCRIPTION OF THE INVENTION

Figure 1:
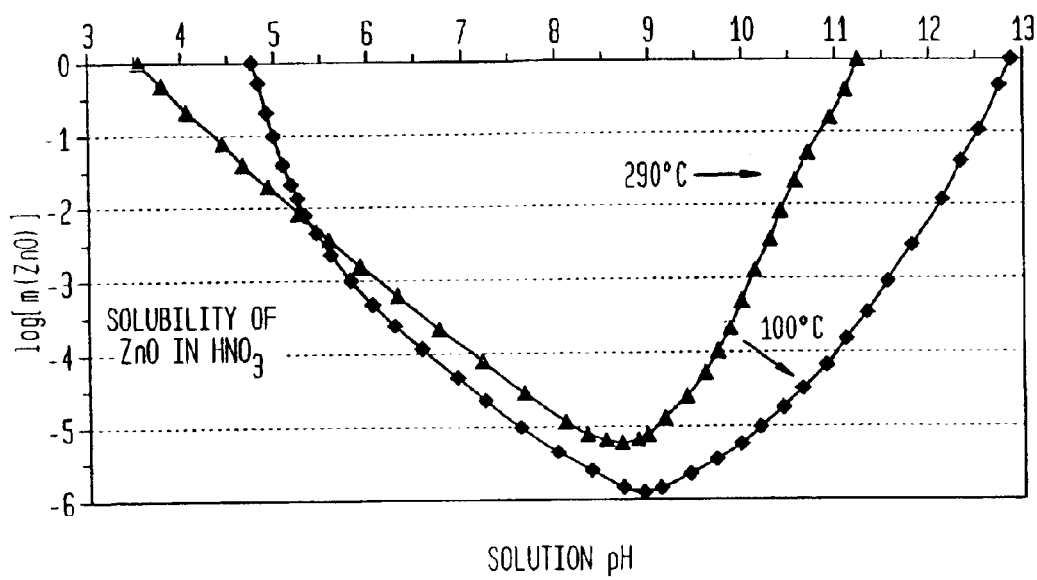
FIG. 1 depicts the solubility of ZnO in $HNO_3$ calculated as a function of solution pH at 100° C. (diamonds) and 290° C. (triangles)

The invention provides a mineralizer composition comprising a mineral acid for dissolving ZnO combined with a first additive comprising at least one ligand capable of coordinating $Zn^{2+}$ ions and, optionally, combined with a second additive comprising one or more dopant cations for incorporation into the ZnO crystal lattice. Mixtures of acids will also function in this invention. The amount of first additive will depend on the solubility of ZnO in the mineral acid at the low temperature end of the process range, which is a physical constant that is readily determined by one of ordinary skill in the art without undue experimentation, and should be in an amount sufficient to coordinate substantially all of the zinc in solution and to provide retrograde solubility of ZnO, which also readily-determined by the skilled artisan without undue experimentation. A mixture of ligands can function as the first additive.

The amount of the second additive will depend on the amount of dopant to be incorporated in the ZnO crystal lattice and on the partition coefficient for the dopant ion between the solution and the crystal, which is another readily-determined physical constant that can be identified by one of ordinary skill without undue experimentation. In a preferred embodiment of the invention the mineral acid is either nitric acid or hydrochloric acid; the $Zn^{2+}$-coordinating ligand is acetate, benzoate, or formate; and the dopant cation is taken, alone or in combination, from the group: $Li^+$, $Cu^+$, $Ag^+$, $Mg^{2+}$, $Cu^{2+}$, $Ni^{2+}$, $Co^{2+}$, $Fe^{2+}$, $Mn^{2+}$, $Al^{3+}$, $Ga^{3+}$, $In^{3+}$, $Cr^{3+}$, $Mn^{3+}$, $Fe^{3+}$, $Cr^{4+}$ and $Mn^{4+}$. Some or all of the ligand and dopant can be added as a single compound of both species.

The invention also provides a method of using the mineralizer composition to grow pure or doped ZnO crystals; pure or doped ZnO thick or thin films; and pure or doped ZnO crystalline powders. Typical single crystal growth rates are about 0.25 mm/day. To grow pure or doped ZnO single crystals the mineralizer solution is saturated with ZnO, a seed crystal is placed in the ZnO-saturated mineralizer solution, and the solution is slowly heated to a temperature at which a supersaturation condition exists at a rate of heating that drives ZnO growth on the seed crystal. To grow pure or doped ZnO crystalline powders, the mineralizer solution is saturated with ZnO and the solution is rapidly heated to a temperature at which a supersaturation condition exists at a rate of heating that causes homogeneous nucleation and precipitation of crystalline ZnO powder.

In other embodiments of the inventive method the seed crystals may be single crystal materials other than ZnO upon which ZnO can be grown by heteroepitaxy. Thick and thin films of ZnO and doped ZnO may also be grown on suitable substrates by heteroepitaxy. The terms "thick" and "thin" are being used according to their ordinarily understood meaning in this art with respect to the "thickness" or "thin-ness" dimension of an optionally doped single crystal film grown on a substrate.

To grow pure or doped ZnO thick or thin films the mineralizer solution is saturated with ZnO, the solution is contacted with a substrate for the thick or thin film, and the solution is heated to a temperature at which a supersaturation condition exists at a rate of heating that drives heteroepitaxial ZnO growth on said substrate. As noted above, this process is repeated to produce a multi-layer laminate. Multiple layers of the same material may be applied, or multiple layers may be applied that are different, either by having a different dopant cation, or by being dopant-free.

In preferred methods, the first temperature at which the saturated solution is formed is about 50° C. and the saturated solution is then heated to about 250° C. to achieve supersaturation. A method with a first temperature at which the saturated solution is formed of about 100° C., after which the saturated solution is heated to about 200° C. is more preferred.

Heating rates to temperatures at which supersaturation conditions exist that produce ZnO deposition and single crystal growth, and heating rates to temperatures at which supersaturation conditions exist that produce homogeneous nucleation and precipitation of crystalline ZnO powder are also well understood by those having ordinary skill in the art upon reading the present specification. The homogeneous nucleation and precipitation resulting from the rapid heating of a retrograde solution to a temperature at which a supersaturation condition exists is the retrograde solution equivalent of the homogeneous nucleation and precipitation produced by the rapid cooling of a normal solution to a supersaturation condition temperature, which is thoroughly understood. It is within the realm of routine experimentation to determine which retrograde solution heating rates will drive ZnO growth on a single crystal or substrate, and which will result in homogeneous nucleation and precipitation of crystalline ZnO powder.

Single crystal growth on seed crystals and suitable substrates from supersaturated solutions is otherwise well known (as are the suitable substrates) and requires no further explanation. The same is true with respect to the homogeneous nucleation and precipitation of crystalline powders from supersaturated solutions. The inventive methods are simply adapted to established commercial processes using the less rigorous conditions of temperature and pressure made possible by the present invention. The resulting improvements to commercial processes, such as the use of lighter and less expensive reaction containment equipment are the predictable result of the within disclosure.

To illustrate one specific embodiment of the inventive method, a mineralizer solution according to the present invention is contained in a vessel comprising two zones that are maintained at different temperatures. A seed crystal (or seed crystals) is (are) suspended in the higher temperature growth zone and solid ZnO nutrient is placed in the lower temperature nutrient zone. Under steady-state growth conditions, the nutrient dissolves in the cooler zone, thereby forming a saturated ZnO solution, which is transported to the hotter zone by thermal convection or by forced convection. A temperature differential and rate of transport is established that creates-a supersaturation condition in the hotter zone, driving the deposit of ZnO on the seed crystal(s). ZnO replenishment in the cooler zone maintains ZnO saturation and the steady-state condition of the reactor. Large crystals are thereby produced. In this depicted embodiment of the inventive method a temperature differential between about 5 and about 25° C. is maintained between the two zones.

While the practice of this invention is not bound by any theory or explanation the following discussion teaches a rationale for its operation.

Historically, hydrothermal crystal growth processes for growing ZnO single crystals have used aqueous chemistries that take place in strongly basic solutions. These processes have ignored the fact that ZnO is an amphoteric oxide, which means that ZnO acts as an acid in the presence of a base and as a base in the presence of an acid. The former characteristic accounts for the solubility of ZnO in basic solutions. The latter characteristic means that it will also dissolve in acidic solutions. The amphoteric property of ZnO is illustrated in FIG. 1, which shows the solubility limit for ZnO at two temperatures as a function of pH. One curve shows the solubility of ZnO as a function of pH in the nitric acid/potassium hydroxide system at 100° C. and the other curve shows it at 290° C. It is clear from this diagram that ZnO is as soluble in acid as in base, and as soluble at the lower temperature as at the higher temperature if the pH of the solution is adjusted.

Figure 2:
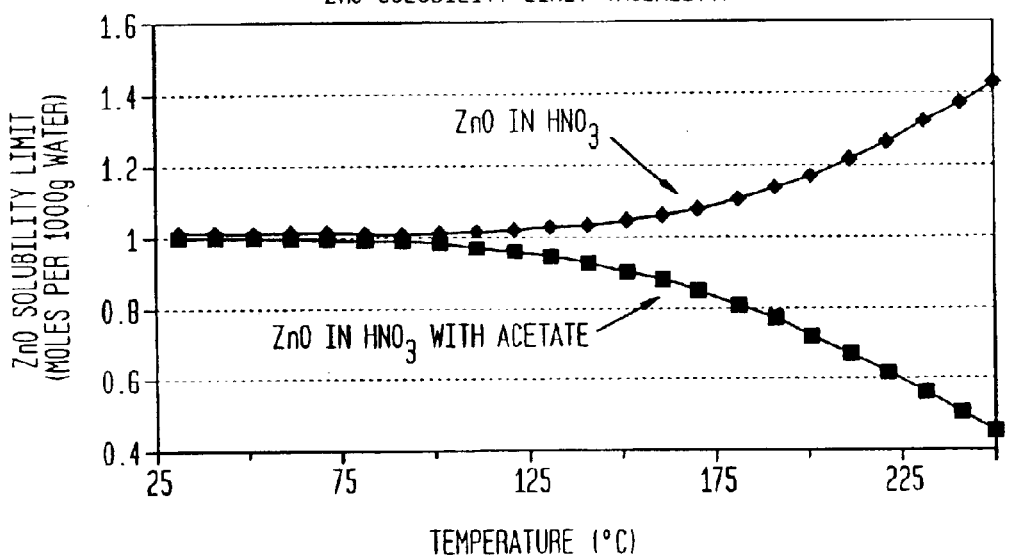
FIG. 2 depicts the solubility of ZnO in 2 molal $HNO_3$ (diamonds) and solubility of ZnO in 2 molal $HNO_3$ plus 2.5 molal $KOOCCH_3$ (squares)

An increase in solubility with increase in temperature is a characteristic of most substances. This type of behavior is called 'normal' solubility. The opposite behavior, decreasing solubility with increasing temperature, is called 'retrograde' solubility and is rare. It is not clear from FIG. 1 that the solubility of ZnO in water is 'normal' over the temperature and pH ranges shown. This is because the ion product of water is a function of temperature, as is the hydrogen ion activity coefficient. An acidic ZnO solution becomes more acidic when it is heated and the solubility of ZnO increases even though its solubility might (depending on the temperature) decrease if the pH was held constant. Furthermore, as ZnO dissolves in water, it acts as an acid and lowers the pH. FIG. 2 shows the solubility limit of ZnO in a nitric acid solution as a function of temperature. Its pH is 6.37 at room temperature (21° C.). Under these conditions a 1 molal solution of ZnO is saturated. As the temperature of this solution is increased, it rapidly becomes evermore undersaturated, so that at 250° C. more than 40% additional ZnO would be required to bring the solution back to a saturated condition. Thus the solubility of ZnO in nitric acid is 'normal'. What was unexpectedly discovered was that addition of potassium acetate ($KOOCCH_3$) to $HNO_3$ switched the solubility of ZnO from 'normal' to 'retrograde', i.e. lower solubility at higher temperature.

Figure 3:
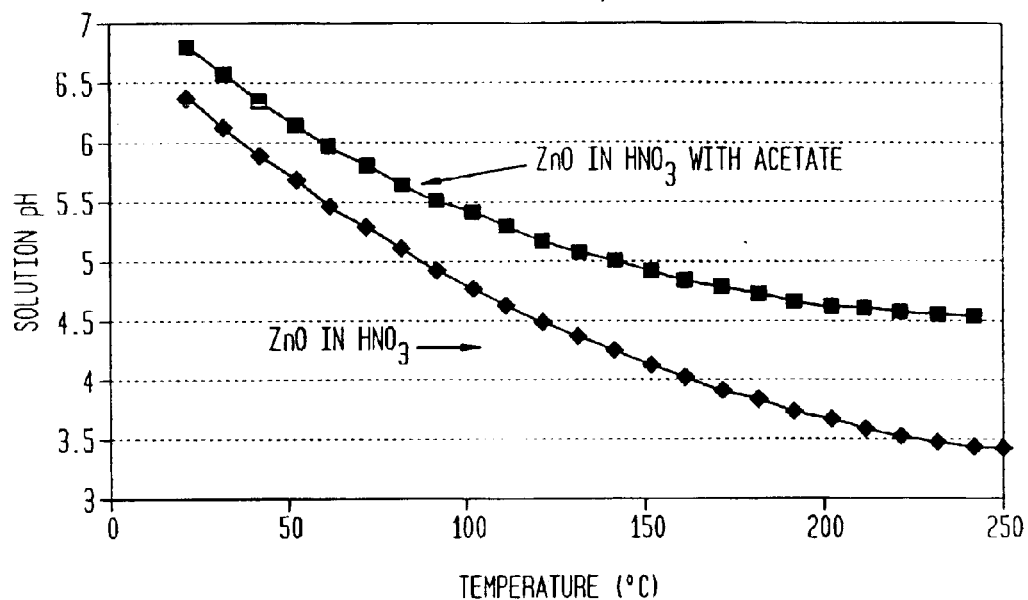
FIG. 3 depicts the temperature dependence of pH of a solution of ZnO in 2 molal $HNO_3$ (diamonds) and of a solution of ZnO in 2 molal $HNO_3$ plus 2.5 molal $KOOCCH_3$ (squares)

Thermodynamic calculations show in FIG. 2 that the solubility of ZnO in 2 molal $HNO_3$ increases with increasing temperature while its solubility in 2 molal $HNO_3$ plus 2.5 molal $KOOCCH_3$ decreases with increasing temperature between 20° C. and 250° C. FIG. 3 shows that the pH of both solutions decreases as they are heated.

Figure 4:
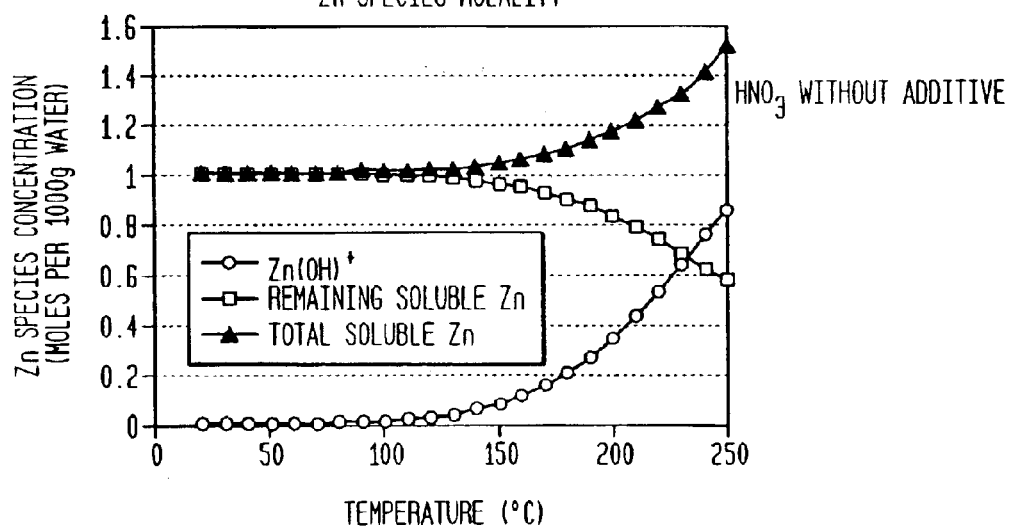
FIG. 4 depicts the temperature dependence of the concentration of $Zn(OH)^+$ (circles) and other soluble zinc species (squares) to the overall solubility of ZnO (triangles) in nitric acid (2 m) solution.

Further detailed thermodynamic calculations show that only four solutions species account for almost all zinc when ZnO (s) is dissolved in $HNO_3$ (aq). The calculations show that $Zn^{2+}$ ion predominates at temperatures up to about 200° C. where $Zn(OH)^+$ ion takes over. Below 190° C. the next highest concentration belongs to $Zn(NO_3)^+$ ion while $Zn(NO_3)_2$ (aq) and $Zn(OH)^+$ ion make minor contributions to the distribution of Zn below 100° C. As the solution is heated above 100° C. the concentration of $Zn^{2+}$ ion decreases rapidly while that of $Zn(OH)^+$ ion increases even more rapidly. The concentration of $Zn(NO_3)^+$ ion rises slightly and then falls back to where it was at 100° C. At the same time the $Zn(NO_3)_2$ (aq) concentration rises and meets the concentrations of $Zn(NO_3)^+$ ion and $Zn^{2+}$ ion at 250° C. At 250° C. $Zn(OH)^+$ ion is the dominant species, its rapid rise being fed at the expense of $Zn(NO_3)^+$ ion and $Zn^{2+}$ ion. This is illustrated in FIG. 4 where it is seen how the $Zn(OH)^+$ concentration determines the 'normal' solubility property of ZnO in nitric acid solution.

The calculations show that addition of potassium acetate, $KOOCCH_3$ (s) to $HNO_3$ (aq) changes the picture completely. In this case acetate complexes of $Zn^{2+}$ dominate the distribution of aqueous zinc species. At ambient temperature, in decreasing order of importance, these are $Zn(CH_3COO)_3^-$ ion, $Zn(CH_3COO)_2$ (aq) and $Zn(CH_3COO)^+$ ion. The order of importance at 250° C. is $Zn(CH_3COO)_2$ (aq)>$Zn(CH_3COO)_3^-$ ion>$Zn(CH_3COO)^+$ ion. At all temperatures between 20° C. and 250° C. the species that dominate in the absence of potassium acetate are of minor importance. As the solution is heated, ZnO (s) is precipitated with the concurrent formation of $CH_3COOH$ (aq) and $KOOCCH_3$ (aq). These latter two species have equal concentrations at about 160° C. They form a buffer system, which accounts for the leveling off of pH as the solution is heated above this temperature as is observed in FIG. 3.

Figure 7:
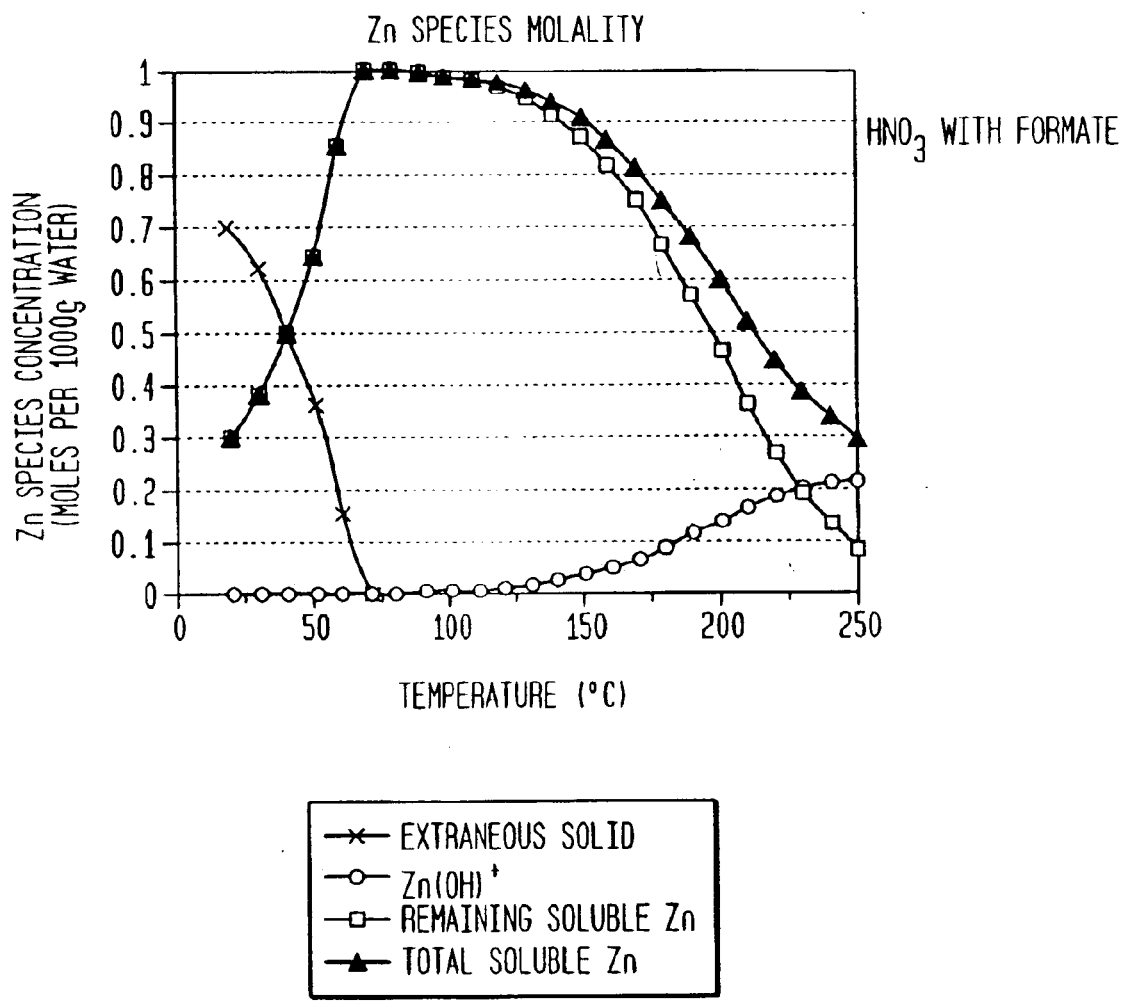
FIG. 7 depicts the temperature dependence of the concentration of $Zn(OH)^+$ (circles) and other soluble zinc species (squares) to the overall solubility of ZnO (triangles) in nitric acid (2 m) solution to which potassium formate (2.5 m) has been added.

FIG. 5 shows how the dominance of $Zn(OH)^+$'s contribution to the overall solubility of ZnO can be overcome by addition of a ligand such as acetate, $CH_3COO^-$, which can form highly soluble complexes with $Zn^{2+}$ in solution. As can be seen from FIG. 5, when such complexes form, the solubility of ZnO in solution can be changed from 'normal' to 'retrograde'. Acetate is not unique in this regard, as can be seen in FIG. 6, which is a plot corresponding to FIG. 5 but for the case of addition of benzoate ion, and FIG. 7, which is the corresponding plot for formate ion addition. There is no reason to believe that other coordinating ligands will not also work in this invention as long as they inhibit the formation of $Zn(OH)^+$ ions in solution.

The present invention thus provides low-temperature hydrothermal ZnO crystal growth from acid solution, which is preferable to high-temperature hydrothermal crystal growth from basic solution because it is cost-lowering and enabling in many important ways. (1) The growth solution can be saturated with ZnO at room temperature and the supersaturation needed for crystal growth can be achieved, simply, by slowly heating the solution. (2) The use of very thin ZnO seed plates is possible since one does not have to fear the dissolution of the seed upon heating, as is the case when normal basic mineralizer is used and the solubility of ZnO increases with increasing temperature. (3) Practical crystal growth rates can be achieved at temperatures below 250° C., which means that inexpensive polytetraflluoroethylene (PTFE or Teflon™) autoclave liners can be used rather than precious metal liners. PTFE is chemically inert and facilitates controlling the purity of ZnO crystals. Higher purity and more precise doping is attainable compared to all other growth methods. (4) Crystallization at mild (<250° C.) hydrothermal conditions involves the containment of fluid at much lower pressure (<560 psig) than is the case at severe hydrothermal conditions (20,000 psig). This means that lighter and less expensive autoclaves can be used. It also means that pressure vessels can be made very large, to accommodate growth of many crystals in one vessel, which enables economy-of-scale and compensates for a slow intrinsic growth rate as compared to growth rates attained in non-hydrothermal methods.

Furthermore, (5) low process temperatures require less energy, which lowers operating costs. (6) The required supersaturation for crystal growth can also be achieved in the acid system by means of a temperature differential, as is the case in normal hydrothermal growth of ZnO from basic solution. In the acid case the nutrient material is placed in the cooler zone at the top of the autoclave and the seed crystals are placed in the hotter zone at the bottom of the autoclave, which is just opposite of the placement in the classical hydrothermal case. (7) Entirely new chemistries for the incorporation of dopant ions are made possible or easier because the chemical environment is acidic rather than basic. Thus, Mg doping to increase the size of the bandgap, Cu and/or Li doping to produce p-type semiconductivity, Al or Ga doping to produce n-type semiconductivity, and doping with other transition metals like Co or Ni is facilitated. (8) The process is suitable for growing thick ZnO films on epi-GaN(buffer)/sapphire substrates or on epi-ZnO/sapphire substrates, enabling the growth of large-diameter, thick-film ZnO substrates. The diameter of these substrates is only limited by the diameter of available sapphire crystals. (9) Large-diameter, epi-GaN(buffer)/sapphire or epi-ZnO/sapphire substrates can also be used as seeds for the growth of thick, large-diameter single crystals of ZnO, thereby avoiding the time consuming process of obtaining large seed crystals by enlargement of smaller seed crystals through repeated growth runs.

EXAMPLES

The following examples are illustrative of the invention:

Example 1
Mineralizer Composition Without Dopant 19.39 grams of concentrated (65%) nitric acid was added to 93.21 g of deionized water to form a 2 molal nitric acid solution. 24.53 grams of potassium acetate was dissolved in the nitric acid solution to form a mineralizer composition that was 2.5 molal in acetate ion.

Example 2
Mineralizer Composition with $Cu^{2+}$ Dopant 0.23 g of $Cu(NO_3)_2 \cdot 2.5H_2O$ was added as a dopant to a solution of mineralizer prepared as in Example 1 to form a mineralizer composition that was 0.01 molal in $Cu^{2+}$ ion.

Example 3
Mineralizer Composition with $Co^{2+}$ Dopant 0.29 g of $Co(NO_3)_2 \cdot 6H_2O$ was added as a dopant to a solution of mineralizer prepared as in Example 1 to form a mineralizer composition that was 0.01 molal in $Co^{2+}$ ion.

Example 4
Mineralizer Composition with $Ni^{2+}$ Dopant 0.24 g of $NiCl_2 \cdot 6H_2O$ was added as a dopant to a solution of mineralizer prepared as in Example 1 to form a mineralizer composition that was 0.01 molal in $Ni^{2+}$ ion.

Example 5
Mineralizer Composition with $Cu^{+1}$ and $Li^{+1}$ Co-Dopants 18 grams of concentrated (70%) nitric acid was added to 99.6 g of deionized water to form a 2 molal nitric acid solution. 24.53 grams of potassium acetate was dissolved in the nitric acid solution to form a mineralizer composition that was 2.5 molal in acetate ion. 0.0715 grams of $Cu_2O$ was added as a dopant and 0.102 grams of $LiOOCCH_3$ was added as a co-dopant to the solution to form a mineralizer composition that was 0.01 molal in $Cu^+$ ion and 0.01 molal in $Li^+$ ion.

Example 6
ZnO Growth on a ZnO Single Crystal Seed

High-purity (99.995%) ZnO powder was dissolved in the mineralizer composition of Example 1 at ambient temperature to form a nutrient solution that was saturated in ZnO. The saturated solution was pumped through a 1 $\mu$m PTFE filter to remove any particulate material that could act as a heteronucleus for ZnO precipitation. 70 ml of the filtered solution was placed in a Teflon™-lined PARR autoclave with a capacity of 100 ml (i.e 70% fill). A ZnO single crystal seed weighing 0.7 grams was suspended in the mineralizer solution and the autoclave was sealed. The autoclave was placed in an oven and the temperature of the oven was ramped from 50 to 225° C. in a linear fashion over a period of 100 hours and held there for an additional 13 hours. The autoclave was removed from the oven and its temperature was quenched to ambient temperature with water. The crystal seed had a net weight gain of 0.14 grams (20%).

Example 7
$Cu^{2+}$-Doped ZnO Growth on a ZnO Single Crystal Seed

The mineralizer composition of Example 2 was used in a crystal growth run performed on a 1.00 gram ZnO single crystal seed as in Example 6 except that the temperature was first ramped from ambient to 100° C. in 20 hours, followed by a ramp to 225° C. in the next 100 hours after which the autoclave was quenched to ambient temperature. The crystal seed had a net weight gain of 0.20 grams (20%).

Example 8
$Co^{2+}$-Doped ZnO Growth on a ZnO Single Crystal Seed

A growth run was performed on a 1.4 gram ZnO single crystal seed as in Example 7 except that the mineralizer composition of Example 3 was used. The seed crystal had a net weight gain of 0.31 grams (22%).

Example 9
$Ni^{2+}$-Doped ZnO Growth on a ZnO Single Crystal Seed

A growth run was performed on a ZnO single crystal seed as in Example 7 except that the mineralizer composition of Example 4 was used. The seed crystal had a net weight gain of 20%.

Example 10
$Cu^+/Li^+$-Doped ZnO Growth on a ZnO Single Crystal Seed

A growth run was performed on a 0.05 gram ZnO single crystal seed as in Example 7 except that the mineralizer composition of Example 5 was used. The seed crystal had a net weight gain of 0.02 grams (40%).

As will be readily appreciated, numerous variations and combinations of the features set forth above can be utilized without departing from the invention as set forth in the claims. Such variations are not regarded as a departure from the spirit and scope of the invention, and all such variations are intended to be included within the scope of the following claims.

What is claimed is:

1. A mineralizer solution having retrograde solubility for ZnO comprising an aqueous solution of a mineral acid in which ZnO is soluble and at least one compound of a coordinating ligand for $Zn^{2+}$ ions wherein the coordinating ligand compound is present in an amount that is effective to inhibit $Zn(OH)^+$ ion formation as ZnO is dissolved in the solution.

2. The solution of claim 1, wherein said mineral acid is nitric acid, hydrochloric acid, or a mixture thereof.

3. The solution of claim 1, wherein said $Zn^{2+}$-coordinating ligand is selected from the group consisting of acetate, benzoate and formate ligands.

4. The solution of claim 1, further comprising at least one dopant cation.

5. The solution of claim 4, comprising at least one dopant cation selected from the group consisting of $Li^+$, $Cu^+$, $Ag^+$, $Mg^{2+}$, $Cu^{2+}$, $Ni^{2+}$, $Co^{2+}$, $Fe^{2+}$, $Mn^{2+}$, $Al^{3+}$, $Ga^{3+}$ and $In^{3+}$, $Cr^{3+}$, $Mn^{3+}$, $Fe^{3+}$, $Cr^{4+}$ and $Mn^{4+}$.

6. The solution of claim 1, further comprising ZnO dissolved therein.

7. The solution of claim 6, wherein said solution is at a ZnO concentration and temperature at which it is saturated with ZnO.

8. The solution of claim 6, wherein said solution is at a ZnO concentration and temperature at which it is supersaturated with ZnO.

9. A method for growing pure or doped ZnO crystals, comprising the steps of:
heating the mineralizer solution of claim 1 to a first temperature;
dissolving in said mineralizer solution an amount of ZnO effective to form a saturated solution of ZnO therein at said first temperature;
adding a ZnO seed crystal to said ZnO-saturated mineralizer solution; and
heating said ZnO-saturated mineralizer solution to a temperature at which a supersaturation condition exists at a rate of heating that drives ZnO growth on said seed crystal.

10. A method for growing pure or doped ZnO thick or thin films, comprising the steps of:
heating the mineralizer solution of claim 1 to a first temperature;
dissolving in said mineralizer solution an amount of ZnO effective to form a saturated solution of ZnO in said mineralizer solution at said first temperature;
contacting said ZnO-saturated mineralizer solution with a substrate for said thick or thin film; and
heating said ZnO-saturated mineralizer solution to a temperature at which a supersaturation condition exists at a rate of heating that drives heteroepitaxial ZnO growth on said substrate.

11. A method for growing pure or doped ZnO crystalline powders, comprising the steps of:
heating the mineralizer solution of claim 1 to a first temperature;
dissolving in said mineralizer solution an amount of ZnO effective to form a saturated solution of ZnO in said mineralizer solution at said first temperature; and
heating said ZnO-saturated mineralizer solution to a temperature at which a supersaturation condition exists at a rate of heating that causes homogeneous nucleation and precipitation of crystalline ZnO powder.

12. The method of claim 9, 10 or 11, wherein said first temperature is at or above 50° C. and said saturated solution is heated to a temperature up to about 250° C.

13. The method of claim 12, wherein said first temperature is at or above 100° C. and said saturated solution is heated to a temperature up to about 200° C.

14. The method of claim 10, further comprising the steps of repeating said method to form a multi-layered article.

15. A method for forming pure or doped ZnO crystals, comprising the steps of:
providing a vessel comprising first and second zones of the mineralizer solution of claim 1 that are maintained at different temperatures, wherein the mineralizer solution of said first zone is maintained at a temperature lower than the temperature of the mineralizer solution of said second zone;
maintaining a saturated solution of ZnO in said first zone;
suspending at least one ZnO seed crystal in the mineralizer solution of said second zone;
transporting at least a portion of said saturated solution of ZnO in said first zone to said second zone; and
maintaining a temperature differential and rate of transport between said first zone and said second zone effective to create a supersaturation condition within said second zone that drives ZnO growth on said seed crystal.

16. The method of claim 15, wherein said saturated solution of ZnO is transported to said second zone by thermal convection.

17. The method of claim 15, wherein said saturated solution of ZnO is transported to said second zone by forced convection.

18. The method of claim 15, wherein said temperature differential between said first and second zones is between about 5 and about 25° C.

19. The method of claim 9, 10, 11 or 15, wherein said mineralizer solution further comprises at least one dopant cation.

20. The method of claim 19, wherein said mineralizer solution is doped with at least one cation selected from the group consisting of $Li^+$, $Cu^+$, $Ag^+$, $Mg^{2+}$, $Cu^{2+}$, $Ni^{2+}$, $Co^{2+}$, $Fe^{2+}$, $Mn^{2+}$, $Al^{3+}$, $Ga^{3+}$, $In^{3+}$, $Cr^{3+}$, $Mn^{3+}$, $Fe^{3+}$, $Cr^{4+}$ and $Mn^{4+}$.

21. A cation doped ZnO article, wherein said article is a crystal prepared by the method of claim 9.

22. A cation doped ZnO article, wherein said article is a thick or thin film prepared by the method of claim 10.

23. A cation doped ZnO article, wherein said article is a crystalline powder prepared by the method of claim 11.

24. A cation doped ZnO article, wherein said article is a crystal prepared by the method of claim 15.

25. The article of claim 21, 22, 23 or 24, wherein said ZnO is doped with at least one cation selected from the group consisting of $Li^+$, $Cu^+$, $Ag^+$, $Mg^{2+}$, $Cu^{2+}$, $Ni^{2+}$, $Co^{2+}$, $Fe^{2+}$, $Mn^{2+}$, $Al^{3+}$, $Ga^{3+}$, $In^{3+}$, $Cr^{3+}$, $Mn^{3+}$, $Fe^{3+}$, $Cr^{4+}$ and $Mn^{4+}$.

* * * * *